United States Patent [19]
Cho

[11] Patent Number: 5,638,328
[45] Date of Patent: Jun. 10, 1997

[54] DATA OUTPUT BUFFERS AND METHODS HAVING A CLAMP FUNCTION

[75] Inventor: Ho-Yeol Cho, Seoul, Rep. of Korea

[73] Assignee: Samsung Electronics Co., Ltd., Suwon, Rep. of Korea

[21] Appl. No.: 649,106

[22] Filed: May 17, 1996

[30] Foreign Application Priority Data

May 25, 1995 [KR] Rep. of Korea .................. 13269/1995

[51] Int. Cl.$^6$ .................................................. G11C 7/00
[52] U.S. Cl. ........................... 365/189.05; 365/189.06; 365/203; 326/88
[58] Field of Search .............................. 365/203, 189.05, 365/230.08, 189.06; 326/88

[56] References Cited

U.S. PATENT DOCUMENTS

| | | | |
|---|---|---|---|
| 5,241,502 | 8/1993 | Lee et al. | 326/88 |
| 5,268,600 | 12/1993 | Yeu | 326/88 |
| 5,469,385 | 11/1995 | Smith et al. | 365/189.05 |

*Primary Examiner*—David C. Nelms
*Assistant Examiner*—Huan Hoang
*Attorney, Agent, or Firm*—Bell, Seltzer, Park & Gibson, P.A.

[57] ABSTRACT

An integrated circuit data output buffer which may be used in an integrated circuit memory device, includes a data output circuit which is responsive to a data input signal to generate a data output signal, using a boosting data signal. A pulse generator generates a pulse in response to a control signal. A power supply sensing circuit is connected to the pulse generator, and generates a power supply voltage sensing signal in response to the pulse. A clamp circuit is connected to the power supply voltage sensing circuit and to the data output circuit, to clamp the boosting power signal after a predetermined time in response to the power supply voltage sensing signal. Accordingly, output data is buffered by generating a pulse in response to a control signal and generating a power supply voltage sensing signal in response to the pulse. A boosting data signal is clamped after a predetermined time in response to the power supply voltage sensing signal and a data output signal is generated in response to a data input signal, using the clamped boosting data signal. In an integrated circuit memory device, the control signal may be a row address strobe signal.

16 Claims, 5 Drawing Sheets

DATA OUTPUT BUFFERS AND METHODS HAVING A CLAMP FUNCTION

FIELD OF THE INVENTION

This invention relates to integrated circuit devices such as semiconductor memory devices, and more particularly to data output buffers and buffering methods for integrated circuit devices such as memory devices.

BACKGROUND OF THE INVENTION

A data output buffer is generally used in an integrated circuit device such as a semiconductor memory device, to change a CMOS level of data generated on the integrated circuit into a level which is suitable to drive another device external to the integrated circuit. It is well known that due to loading of a data output pin, the data output buffer consumes a large amount of current. Moreover, as the power supply voltage used in the integrated circuit decreases, the output speed of the data buffer generally decreases.

In order to enhance the output speed of the data buffer, it is known to boost a high level data signal in a data output buffer. Although this technology can enhance the transmission speed of the data, it may increase the current consumption of the output buffer. This may cause data output noise which may degrade the operation of the semiconductor memory device. To solve this problem, it is known to use a boosted high level data signal and to clamp the boosted signal.

FIG. 1 shows a prior data output buffer as described above. A data output circuit 10, which receives a pair of data signals DO and $\overline{DO}$ and outputs a data output signal DOUT, is controlled by a data output activation signal φDOE. A signal φX, provided from the data output circuit 10 to a clamp circuit 70, drives a pull-down transistor in the clamp circuit 70. A boosting data signal DOK is boosted by the data output circuit 10 and then transmitted to the clamp circuit 70. The potential of the boosting data signal is clamped by the clamp circuit 70, and affects the level of the data output signal DOUT.

FIG. 2A is a circuit diagram showing the data output circuit 10 of FIG. 1. In FIG. 2A, the data output activation signal φDOE controls the operation of the data output circuit 10. Upon transition of the data output activation signal φDOE to a logic "high" level, the data signals DO and $\overline{DO}$ are input to NAND gates 4 and 6, respectively. If the data which is read out from the memory or other integrated circuit is "1", the data signal DO stays at the logic "high" level, whereas the inverted data signal $\overline{DO}$ stays at the logic "low" level. Thus, with the transition of the potential of a node 39 to a logic "high" level, the potential of the node 25, from which an initial boosting data signal DOKI is generated, becomes Vcc+2Vth (where Vth is a threshold voltage of an NMOS transistor), due to NMOS capacitor 24. The node 25 was precharged to the Vcc level when the data output activation signal φDOE was at a logic "low" level. Since the output node 38 of the NAND gate 2 is at the logic "low" level, the PMOS transistor 26 is turned on, thereby causing the boosting data signal DOK to follow the initial boosting data signal DOKI at Vcc+2Vth.

FIG. 2B shows the clamp circuit 70 of FIG. 1. Referring to FIG. 2B, the boosting data signal DOK, which is output from the data output circuit 10 of FIG. 2A, is clamped by charge sharing with an NMOS capacitor 21 through a PMOS transistor 17. The data output signal DOUT follows the boosting data signal DOK which has been clamped as described above.

However, in a semiconductor memory device or other integrated circuit which uses a low voltage power supply voltage Vcc, such as 3.3 volts, the PMOS transistor 17 in FIG. 2B may be turned on before the boosting data signal DOK is sufficiently boosted. That is, even though the power supply voltage of 3.3 volts is applied to the gate of the PMOS transistor 17, the PMOS transistor 17 may be turned on by the boosted potential of the boosting data signal DOK which is applied to a source thereof. This may degrade the transition speed of the data output signal DOUT. Consequently, it may be difficult to obtain a stable, high level data output signal DOUT, since the data output signal DOUT follows the boosting level of the boosting data signal DOK, and the boosting data signal DOK is clamped before reaching a sufficient boosting level.

SUMMARY OF THE INVENTION

It is therefore an object of the invention to provide improved data output buffering circuits and methods for integrated circuit devices.

It is another object of the present invention to provide improved data output buffering circuits and methods for integrated circuit memory devices.

It is yet another object of the present invention to provide data output buffering circuits and methods which can provide high speed data outputs and can develop a stable data output in integrated circuit devices using low power supply voltages.

These and other objects are provided according to the present invention by an integrated circuit data buffer which may be used with an integrated circuit memory device and which includes a data output circuit which is responsive to a data input signal to generate a data output signal using a boosting data signal. The data output buffer also includes a pulse generator which generates a pulse in response to a control signal. When the data output buffer is used with an integrated circuit memory, the control signal may be a row address strobe signal. A power supply voltage sensing circuit is connected to the pulse generator, and generates a power supply voltage sensing signal in response to the pulse. Finally, a clamp circuit, connected to the power supply voltage sensing circuit and to the data output circuit, clamps the boosting data signal after a predetermined time in response to the power supply voltage sensing signal. The integrated circuit data output buffer may also include a precharge circuit, connected to the control signal and to the power supply voltage sensing circuit, which precharges the power supply voltage sensing signal for a predetermined time in response to the control signal.

In a preferred embodiment of the present invention, the clamp circuit includes a clamp control node and a first switching transistor which is connected between the clamp control node and an initial boosting data signal which is in phase with a boosting data signal. A delaying circuit is connected to the boosting data signal to generate a delayed boosting signal. A first pull-down transistor is connected to the clamp control node, and is controlled by the delayed boosting signal. A second switching transistor is connected to the boosting data signal and is controlled by the clamp control node. A second pull-down transistor is connected to the second switching transistor, and is controlled by a pull-down control signal which responds to the data signal. Finally, a capacitor is connected in parallel with the second pull-down transistor. The first switching transistor and the first pull-down transistor may be controlled by a logical combination of the boosting data signal and the power supply voltage data signal.

Also, in a preferred embodiment of the present invention, the precharge circuit may include a delay circuit which generates a delayed control signal from the control signal. A logic circuit combines the control signal and the delayed control signal. A transistor is controlled by the logic circuit. The pulse generator may also include a second delay circuit, which generates a second delayed control signal from the control signal, and a second logic circuit which combines the control signal and the second delayed control signal to generate the pulse.

In data output buffering methods according to the present invention, a pulse is generated in response to a control signal which may be a memory row address strobe signal, and a power supply voltage sensing signal is generated in response to the pulse. A boosting data signal is clamped after a predetermined time in response to the power supply voltage sensing signal, and a data output signal is generated in response to a data input signal using the clamped boosting data signal.

Data output buffering methods may also include the step of precharging the power supply voltage sensing signal for a predetermined time in response to the control signal. The precharging step may be provided by generating a delayed control signal from the control signal and logically combining the control signal and the delayed control signal. The pulse generating step may be performed by generating a second delayed control signal from the control signal and logically combining the control signal and the second delayed control signal to generate the pulse.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
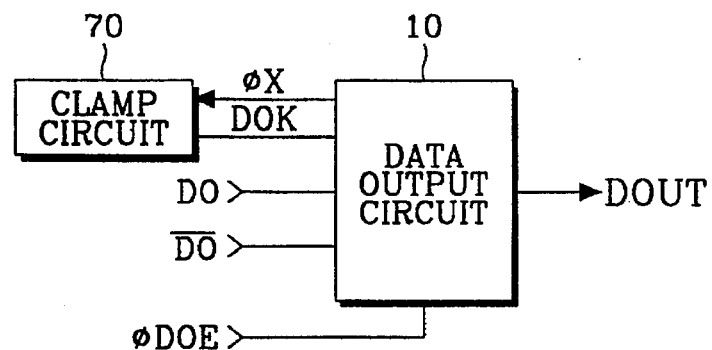
FIG. 1 is a block diagram showing a data output buffer having a clamp function according to the prior art.
Figure 2A:
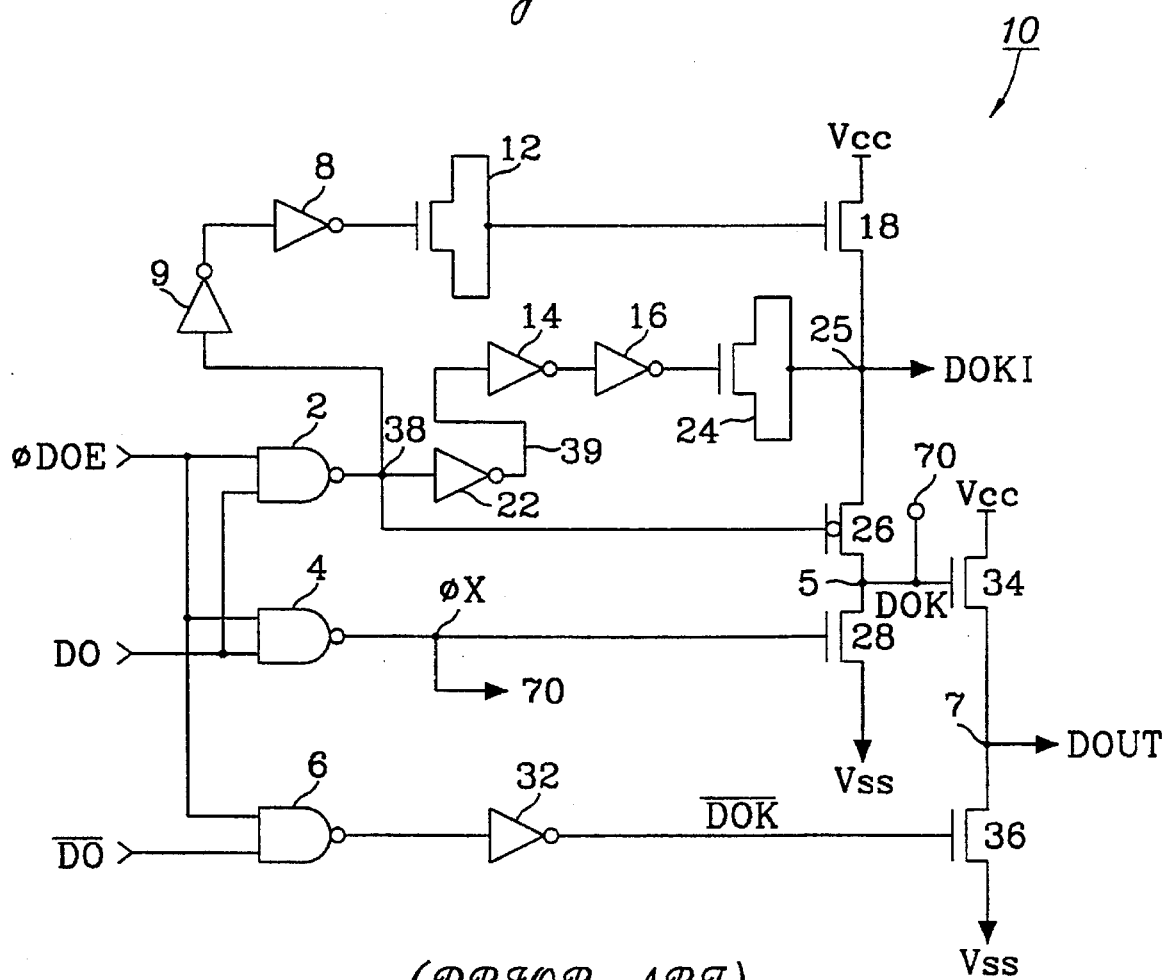
FIG. 2A is a circuit diagram showing a data output circuit for the data output buffer of FIG. 1.
Figure 3:
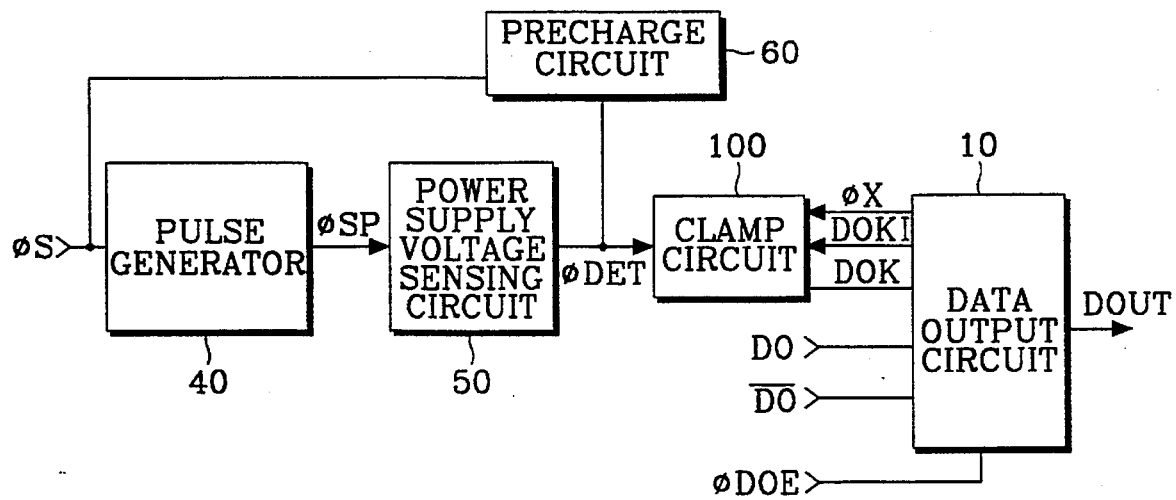
FIG. 3 is a block diagram showing a data output buffer according to the present invention.

Referring now to FIG. 3, a block diagram of a data output buffer according to the invention is shown. The data output circuit 10 used in a preferred embodiment of the present invention may have the same construction as that of FIG. 2A except that a node 25, which generates an initial boosting data signal DOKI, is connected to a clamp circuit 100 of the present invention, as shown in FIG. 3.

Still referring to FIG. 3, a data output buffer of the present invention includes a pulse generator 40, a power supply voltage sensing circuit 50, a precharge circuit 60, a clamp circuit 100 and the data output circuit 10. The pulse generator 40 generates a short pulse φSP in response to a master control signal φS which may correspond to a row address strobe signal $\overline{RAS}$ in a memory device, and applies it to the power supply voltage sensing circuit 50. The power supply voltage sensing circuit 50 generates a power supply voltage sensing signal φDET in response to the pulse φSP, and applies it to the clamp circuit 100. The precharge circuit 60 precharges the power supply voltage sensing signal φDET in response to the master control signal φS. The clamp circuit 100 receives a pull-down control signal φX, the initial boosting data signal DOKI, and a boosting data signal DOK from the data output circuit 10, and clamps and outputs the boosting data signal DOK to the data output circuit 10.

Figure 4:
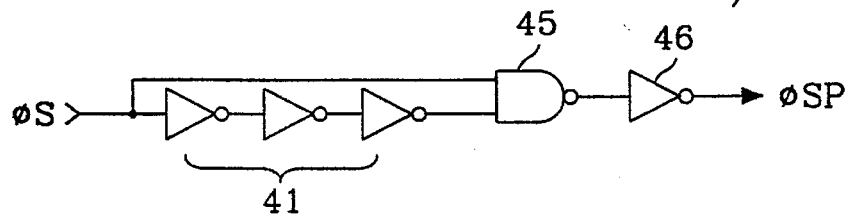
FIG. 4 is a circuit diagram showing a pulse generator for the data output buffer of FIG. 3.

FIG. 4 is a circuit diagram showing a pulse generator 40 of FIG. 3. The pulse generator 40 includes an inverter chain 41 composed of three inverters, a NAND gate 45 and an inverter 46. The master control signal φS is directly applied to the first input terminal of the NAND gate 45, and is also applied to the second input terminal thereof through the inverter chain 41. When the master control signal φS transitions from a logic "low" level to a logic "high" level, the master control signal φS directly applied to the NAND gate 45 first becomes a logic "high" level, while the master control signal φS which is passed through the inverter chain 41 is time-delayed and maintains a logic low state for a predetermined delay time. That is, during the delay time, the master control signal φS directly applied to the NAND gate 45 stays at logic "high" level, whereas the master control signal φS which is passed through the inverter chain 41 stays at a logic "low" level. Thus, during the delay time, the NAND gate 45 applies an output signal at the logic low level to the input terminal of the inverter 46, and then the inverter 46 applies a short pulse φSP at the logic high level to the power supply voltage sensing circuit 50.

Figure 5:
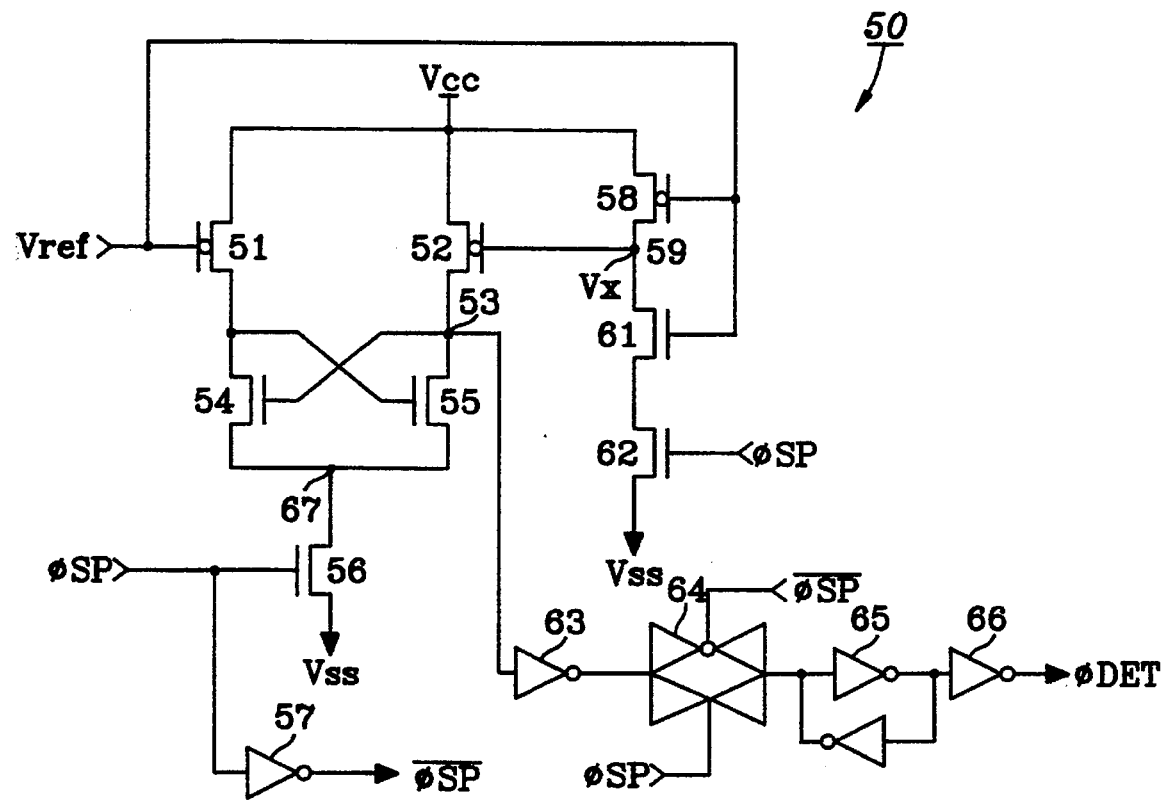
FIG. 5 is a circuit diagram showing a power supply voltage sensing circuit for the data output buffer of FIG. 3.

FIG. 5 shows a power supply voltage sensing circuit 50 of FIG. 3. In FIG. 5, PMOS transistors 51 and B2 and NMOS transistors 54, 55 and 56 constitute a differential amplification circuit. A PMOS transistor 58 and NMOS transistors 61 and 62 serve to set a comparing voltage $V_x$ which follows the potential of a power supply voltage Vcc. PMOS transistor 51 has a gate connected to a reference voltage Vref, and is connected between a power supply voltage Vcc and the gate of the NMOS transistor 55. The gate of the NMOS transistor 55 is also connected to the drain of the NMOS transistor 54. PMOS transistor 52 has a gate connected to a node 59, and is connected between the power supply voltage Vcc and the gate of the NMOS transistor 54. The gate of the NMOS transistor 54 is also connected to the drain of the NMOS transistor 55, which is an output node 53 of the differential amplification circuit.

A common source node 67 of the NMOS transistors 54 and 55 is connected to ground potential Vss through the NMOS transistor 56, the gate of which is connected to the short pulse φSP. The short pulse φSP is logic-inverted through an inverter 57. The node 59 is connected to the power supply voltage Vcc through PMOS transistor 58, the gate of which is connected to the reference voltage Vref and to ground potential Vss through series-connected NMOS transistors 61 and 62. The gate of the NMOS transistor 61 is connected to the reference voltage Vref, and the gate of the NMOS transistor 62 is connected to the short pulse φSP.

The output node 53 of the differential amplification circuit is connected to a clock control type buffer 64 through an inverter 63. An output of the clock control type buffer 64 is generated as the power supply voltage sensing signal φDET, via latch circuit 65 and inverter 66. The inverted short pulse $\overline{\phi SP}$ is applied to a P type control electrode of the clock control type buffer 64, and the short pulse φSP is applied to an N type control electrode thereof.

Figure 6:
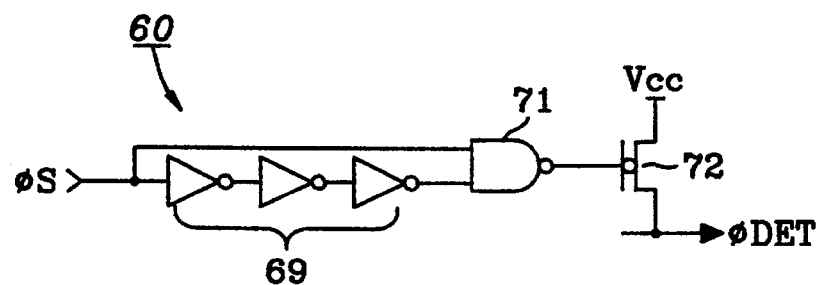
FIG. 6 is a circuit diagram showing a precharge circuit for the data output buffer of FIG. 3.

FIG. 6 is a circuit diagram showing a precharge circuit 60 of FIG. 3. The precharge circuit 60 includes an inverter chain 69 composed of three inverters, a NAND gate 71 and a PMOS transistor 72. The master control signal φS is directly applied to the first input terminal of the NAND gate 71 and is also applied to the second input terminal thereof through the inverter chain 69. The PMOS transistor 72 is connected between the power supply voltage Vcc and the power supply voltage sensing signal φDET, and includes a gate which is connected to the output terminal of the NAND gate 71.

Figure 7:
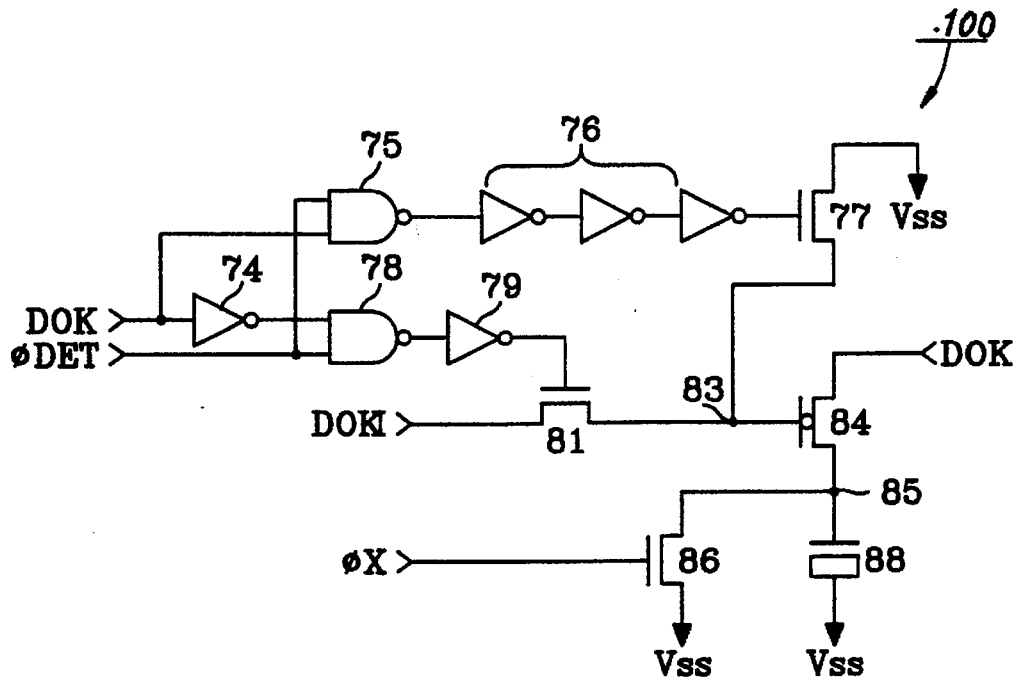
FIG. 7 is a circuit diagram showing a clamp circuit for the data output buffer of FIG. 3.

FIG. 7 shows a preferred embodiment of a clamp circuit 100 of FIG. 3. In FIG. 7, a NAND gate 75 receives the boosting data signal DOK and the power supply voltage sensing signal φDET. The output terminal of the NAND gate 75 is connected to the gate of an NMOS transistor 77 through a delay chain 76 composed of three series-connected inverters. The source of the NMOS transistor 77 is connected to ground potential Vss. A NAND gate 78 receives a logic-inverted boosting data signal DOK at its first input terminal, and receives the power supply voltage sensing signal φDET at its second input terminal. The output terminal thereof is connected to the gate of an NMOS transistor 81 through an inverter 79.

The NMOS transistor 81 is connected between the initial boosting data signal DOKI and the drain of the NMOS transistor 77. The drain of the NMOS transistor 77 serves as a clamp control node 83, and is connected to the gate of a PMOS transistor 84, the source of which is connected to the boosting data signal DOK. The drain of the PMOS transistor 84 serves as a pull-down node 85. An NMOS capacitor 88 and an NMOS transistor 86, the gate of which is connected to the pull-down control signal φX generated from the data output circuit 10, are connected in parallel to each other between the pull-down node 85 and ground potential Vss.

Figure 8:
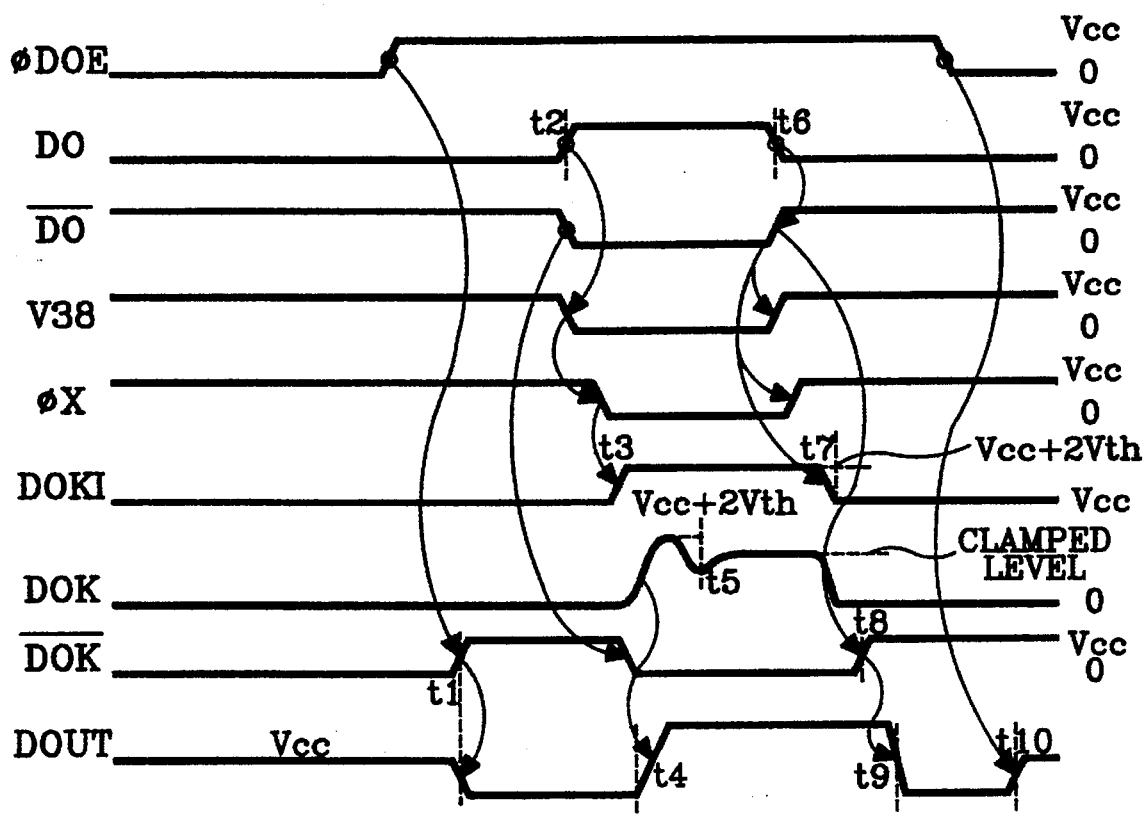
FIG. 8 is an operational timing diagram for the data output buffer of FIG. 3.

FIG. 8 is an operational timing diagram showing a data output buffer according to the present invention. When the data signal DO is at a low level, the signal $\overline{DO}$ stays at a logic "high" level. In this state, if the data output activation signal φDOE is activated to a logic "high" level, the output of the NAND gate 6 in FIG. 2A goes to a logic "low" level. The inverted boosting data signal $\overline{DOK}$, which is applied to the gate of the NMOS transistor 36, goes to a logic "high" level at time t1. At this time, the boosting data signal DOK stays at a logic "low" level, since the output terminal of the NAND gate 2, i.e. the potential of the node 38, stays at a logic "high" level. The NMOS transistor 36 is turned on by the inverted boosting data signal $\overline{DOK}$ at a high level, and the data output signal DOUT thereby changes to a logic "low" level.

Thereafter, when the data signal DO changes to a logic "high" level at time t2, the potential of the node 38 changes from a logic "high" level to a logic "low" level. In addition, the pull-down control signal φX changes from a logic "high" level to a logic "low" level. With the transition of the potential of the node 38 to a logic "low" level, the initial boosting data signal DOKI, which has been precharged to a power supply voltage Vcc level, is boosted to a voltage of Vcc+2Vth by the NMOS capacitor 24 at time t3. The PMOS transistor 26 is turned on by the low level potential of the node 38. The boosting data signal DOK is thereby raised to Vcc+2Vth of the initial boosting data signal DOKI.

The power supply voltage sensing circuit 50 of FIG. 5 is activated by the short pulse φSP generated by the master control signal φS, which was generated in response to the row address strobe signal $\overline{RAS}$. The power supply voltage sensing circuit 50 provides the power supply voltage sensing signal φDET to the clamp circuit 100. This signal changes to a logic "high" level in response to the potential of the output node 53 of the differential amplification circuit. Output node 53 changes to a logic "high" level when the comparing voltage $V_x$ is higher than the reference voltage Vref. In the precharge circuit 60, since the master control signal φS is activated to a logic "high" level, the output of the NAND gate 71 stays at a logic "low" level, thus turning on the PMOS transistor 72 for only a short time at the beginning of the activation period of the master control signal φS.

Thus, the power supply voltage sensing signal φDET is precharged to the power supply voltage Vcc level for a time beginning from the activation of the master control signal φS, until the data signal DO begins to change to the logic "high" level. Unnecessary current consumption can thus be prevented by setting the potential of the clamp control node 83 to Vcc-Vth before a valid data signal DO is generated. Thereafter, if the comparing voltage $V_x$ is higher than the reference voltage Vref, the power supply voltage sensing signal φDET is generated as a logic "high" level. Alternatively, if the comparing voltage $V_x$ is lower than the reference voltage Vref, the power supply voltage sensing signal φDET is generated as a logic "low" level.

In the clamp circuit 100 of FIG. 7, since the pull-down control signal φX is at a logic "low" level, the pull-down NMOS transistor 86 is turned off. Since the NMOS transistor 81 is turned off by the boosting data signal DOK at a high level, the initial boosting data signal DOKI is not applied to the clamp control node 83. After a predetermined delay time created by the delay chain 76 after the potential of the boosting data signal DOK begins to rise, the NMOS transistor 77 is turned on, thereby allowing the potential of the clamp control node 83 to change to a logic "low" level. The PMOS transistor 84 is turned on by the low level potential of the clamp control node 83.

The boosted potential of the boosting data signal DOK thereby charges the NMOS capacitor 88 through the channel of the PMOS transistor 84 at time t5. Since the NMOS capacitor 88 was sufficiently discharged through the channel of the NMOS transistor 86, which was turned on by a high level pull-down control signal φX, it can be charged with the potential of the boosting data signal DOK. Thus, the clamp operation for the boosting data signal DOK is performed at time t5.

Figure 2B:
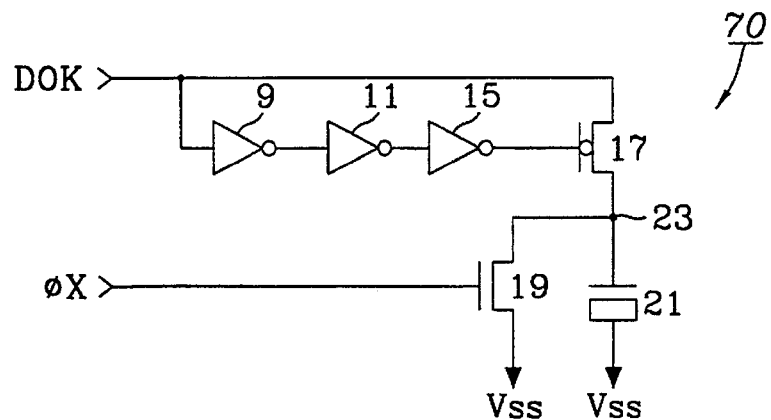
FIG. 2B is a circuit diagram showing a clamp circuit for the data output buffer of FIG. 1.

It should be noted that the boosting data signal DOK is clamped after the lapse of a predetermined delay time in order to provide a time period required to generate a sufficiently high level data output signal DOUT which follows the potential of the boosting data signal DOK. In contrast, in a conventional clamp circuit 70 as shown in FIG. 2B, it may be impossible to provide a time period for sufficient generation of the valid data output signal DOUT, since the boosting data signal DOK is clamped without such a time delay.

After the boosting data signal DOK is clamped, when the data signal DO changes from a logic "high" level to a logic "low" level at time t6, the signal $\overline{DO}$ changes from a logic "low" level to a logic "high" level. The potential of node 38 changes from a logic "low" level to a logic "high" level, and the pull-down control signal φX changes from a logic "low" level to a logic "high" level. In addition, the initial boosting data signal DOKI again transitions to a power supply voltage level (i.e., a precharge voltage level) due to the high level potential of the node 38 at time t7. The PMOS transistor 26 is turned off by the high level potential of the node 38, and the boosting data signal DOK changes to the logic "low" level. The signal DOK changes to the logic "high" level in response to the high level signal $\overline{DO}$ at time t8, thereby turning on the NMOS transistor 36. Then, the data output signal DOUT changes to a logic "low" level at time t9.

In the clamp circuit 100 of FIG. 7, since the pull-down NMOS transistor 86 is turned on by the pull-down control signal φX at a high level, the NMOS capacitor 88, which had been charged during the previous clamp operation, is discharged to ground potential through the channel of the NMOS transistor 86. Since the NMOS transistor 81 is turned on by the boosting data signal DOK changing to a logic "low" level, the clamp control node 83 is precharged to Vcc-Vth by the initial boosting data signal DOKI, which had been precharged to the power supply voltage Vcc level. This precharge potential of the clamp control node 83 prevents the PMOS transistor 84, which serves as a clamp switch, from being turned on when the clamp operation is not performed. After the data output signal DOUT is generated as a low level, if the data output activation signal φDOE is inactivated to a logic "low" level, the data output signal DOUT is precharged to the power supply voltage level Vcc.

Such a clamp operation is performed only when the power supply voltage sensing signal φDET is at a logic high level, that is when the comparing voltage $V_x$ is higher than the reference voltage Vref. This means that since the present power supply voltage is higher than the set reference voltage, the potential of the boosting data signal DOK, which determines the potential of the data output signal DOUT, is clamped so as to reduce the current consumption due to the high voltage at the output driving part, and to suppress data output noise. In contrast, when the power supply voltage sensing signal φDET is at a logic "low" level, i.e. the comparing voltage $V_x$ is lower than the reference voltage Vref, the NMOS transistor 77 in the clamp circuit 100 of FIG. 7 is turned off and the NMOS transistor 81 is thereby turned on. Thus, the PMOS transistor 84 is turned off, causing the clamp operation not to be performed.

Figure 9:
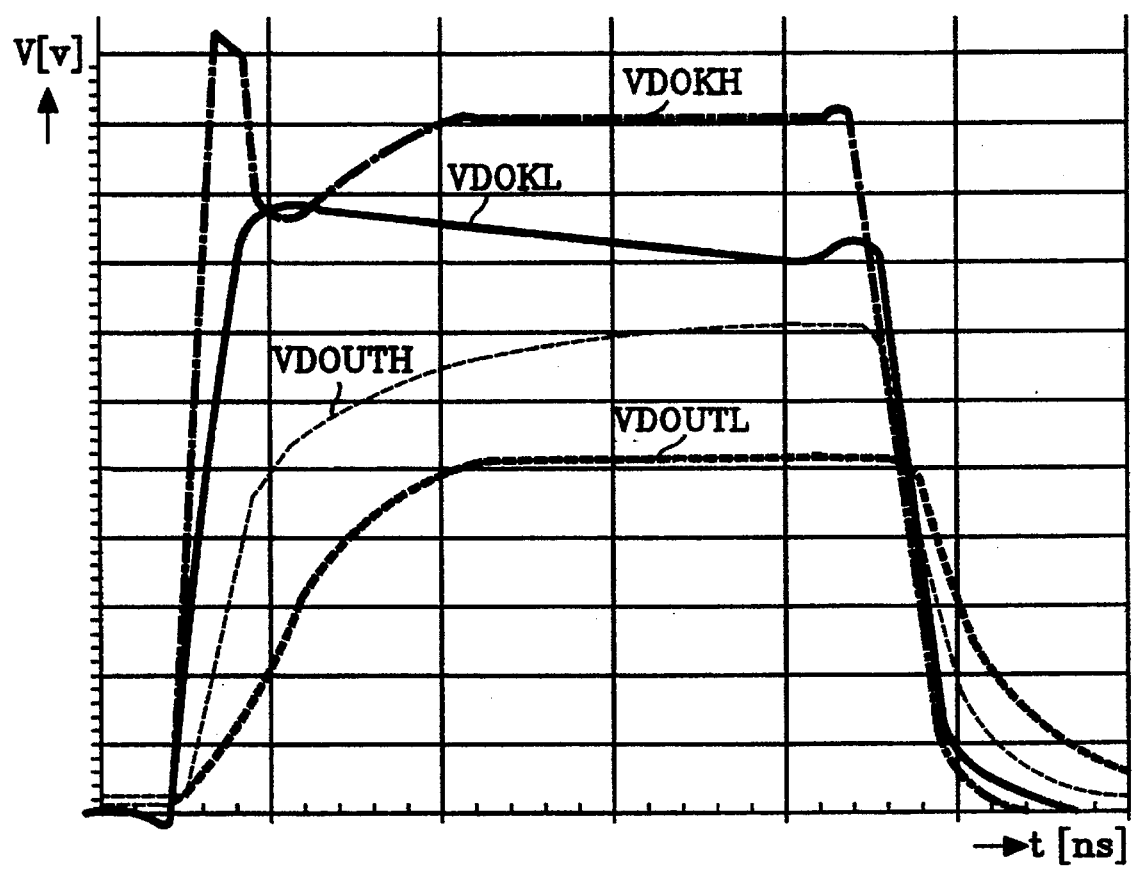
FIG. 9 is a graph showing a simulation result of a data output buffer according to the present invention.

Referring to FIG. 9, for a high power supply voltage, the voltage VDOKH of the boosting data signal DOK is clamped, and the voltage VDOUTH of a corresponding data output signal DOUT follows the clamped voltage VDOUTH. For a low power supply voltage, the voltage VDOKL of the boosting data signal DOK is not clamped, and the voltage VDOUTL of a corresponding data output signal DOUT follows the unclamped voltage VDOKL.

As described above, the present invention can properly control the potential of the boosting data signal which determines the potential of the data output signal according to the potential state of the power supply voltage. Thus, the invention can reduce unnecessary current consumption in the data output buffer and can provide a stable, high level data output signal when a low power supply voltage is used. In addition, the present invention can provide a stable data output due to the voltage gain of the output data and the reduced current consumption.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit data output buffer comprising:

a data output circuit which is responsive to a data input signal to generate a data output signal using a boosting data signal;

a pulse generator which generates a pulse in response to a control signal;

a power supply voltage sensing circuit, connected to said pulse generator, which generates a power supply voltage sensing signal in response to the pulse; and a clamp circuit, connected to said power supply voltage sensing circuit and to said data output circuit, which clamps the boosting data signal after a predetermined time in response to the power supply voltage sensing signal.

2. An integrated circuit data output buffer according to claim 1 further comprising:

a precharge circuit, connected to the control signal and to said power supply voltage sensing circuit, which precharges the power supply voltage sensing signal for a predetermined time in response to the control signal.

3. An integrated circuit data output buffer according to claim 1 wherein said clamp circuit comprises:

a clamp control node;

a first switching transistor, connected between said clamp control node and an initial boosting data signal which is in phase with the boosting data signal;

a delaying circuit, connected to the boosting data signal to generate a delayed boosting signal;

a first pull down transistor connected to said clamp control node, and controlled by the delayed boosting signal;

a second switching transistor connected to the boosting data signal, and controlled by the clamp control node;

a second pull down transistor connected to said second switching transistor, and controlled by a pull down control signal which responds to the data signal; and a capacitor connected in parallel with said second pull down transistor.

4. An integrated circuit data output buffer according to claim 3 wherein said first switching transistor and said first pull down transistor are controlled by a logical combination of the boosting data signal and the power supply voltage sensing signal.

5. An integrated circuit data output buffer according to claim 2 wherein said precharge circuit comprises:

a delay circuit which generates a delayed control signal from the control signal;

a logic circuit which combines the control signal and the delayed control signal; and a transistor which is controlled by the logic circuit.

6. An integrated circuit data output buffer according to claim 5 wherein said pulse generator comprises:

a second delay circuit which generates a second delayed control signal from the control signal; and a second logic circuit which combines the control signal and the second delayed control signal to generate the pulse.

7. An integrated circuit data output buffer for an integrated circuit memory device, comprising:

a data output circuit which is responsive to a data input signal to generate a data output signal using a boosting data signal;

a pulse generator which generates a pulse in response to a row address strobe signal;

a power supply voltage sensing circuit, connected to said pulse generator, which generates a power supply voltage sensing signal in response to the pulse; and a clamp circuit, connected to said power supply voltage sensing circuit and to said data output circuit, which clamps the boosting data signal after a predetermined time in response to the power supply voltage sensing signal.

8. An integrated circuit data output buffer according to claim 7 further comprising:

a precharge circuit, connected to the row address strobe signal and to said power supply voltage sensing circuit, which precharges the power supply voltage sensing signal for a predetermined time in response to the row address strobe signal.

9. An integrated circuit data output buffer according to claim 7 wherein said clamp circuit comprises:

a clamp control node;

a first switching transistor, connected between said clamp control node and an initial boosting data signal which is in phase with the boosting data signal;

a delaying circuit, connected to the boosting data signal to generate a delayed boosting signal;

a first pull down transistor connected to said clamp control node, and controlled by the delayed boosting signal;

a second switching transistor connected to the boosting data signal, and controlled by the clamp control node;

a second pull down transistor connected to said second switching transistor, and controlled by a pull down control signal which responds to the data signal; and a capacitor connected in parallel with said second pull down transistor.

10. An integrated circuit data output buffer according to claim 9 wherein said first switching transistor and said first pull down transistor are controlled by a logical combination of the boosting data signal and the power supply voltage sensing signal.

11. An integrated circuit data output buffer according to claim 8 wherein said precharge circuit comprises:

a delay circuit which generates a delayed row address strobe signal from the row address strobe signal;

a logic circuit which combines the row address strobe signal and the delayed row address strobe signal; and a transistor which is controlled by the logic circuit.

12. An integrated circuit data output buffer according to claim 11 wherein said pulse generator comprises:

a second delay circuit which generates a second delayed row address strobe signal from the row address strobe signal; and a second logic circuit which combines the row address strobe signal and the second delayed row address strobe signal to generate the pulse.

13. A data output buffering method comprising the steps of:

generating a pulse in response to a control signal;

generating a power supply voltage sensing signal in response to the pulse;

clamping a boosting data signal after a predetermined time in response to the power supply voltage sensing signal; and generating a data output signal in response to a data input signal, using the clamped boosting data signal.

14. A data output buffering method according to claim 13 further comprising the step of:

precharging the power supply voltage sensing signal for a predetermined time in response to the control signal.

15. A data output buffering method according to claim 14 wherein said precharging step comprises the steps of:

generating a delayed control signal from the control signal; and logically combining the control signal and the delayed control signal.

16. A data output buffering method according to claim 15 wherein said pulse generating step comprises the steps of:

generating a second delayed control signal from the control signal; and logically combining the control signal and the second delayed control signal to generate the pulse.

\* \* \* \* \*